(12) United States Patent
Xie et al.

(10) Patent No.: US 11,476,163 B2
(45) Date of Patent: Oct. 18, 2022

(54) CONFINED GATE RECESSING FOR VERTICAL TRANSPORT FIELD EFFECT TRANSISTORS

(71) Applicant: International Business Machines Corporation, Armonk, NY (US)

(72) Inventors: Ruilong Xie, Niskayuna, NY (US); Chanro Park, Clifton Park, NY (US); Sung Dae Suk, Watervliet, NY (US); Heng Wu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/851,652

(22) Filed: Apr. 17, 2020

(65) Prior Publication Data

US 2021/0327759 A1    Oct. 21, 2021

(51) Int. Cl.
*H01L 27/088* (2006.01)
*H01L 29/78* (2006.01)
*H01L 21/8234* (2006.01)
*H01L 29/66* (2006.01)

(52) U.S. Cl.
CPC ........... *H01L 21/82345* (2013.01); *H01L 21/823487* (2013.01); *H01L 27/088* (2013.01); *H01L 29/66666* (2013.01); *H01L 29/7827* (2013.01)

(58) Field of Classification Search
CPC ........... H01L 27/088; H01L 29/7827; H01L 29/4966; H01L 29/42392; H01L 21/82345; H01L 21/823487
See application file for complete search history.

(56) References Cited

U.S. PATENT DOCUMENTS

| | | | |
|---|---|---|---|
| 9,502,265 B1* | 11/2016 | Jiang | H01L 29/66469 |
| 9,530,700 B1 | 12/2016 | Mallela et al. | |
| 9,685,537 B1 | 6/2017 | Xie et al. | |
| 9,741,716 B1 | 8/2017 | Cheng et al. | |
| 9,761,727 B2* | 9/2017 | Mallela | H01L 21/82385 |
| 9,780,197 B1 | 10/2017 | Xie et al. | |
| 9,972,494 B1 | 5/2018 | Bentley et al. | |
| 10,014,391 B2 | 7/2018 | Bergendahl et al. | |
| 10,103,247 B1 | 10/2018 | Xie et al. | |
| 10,153,367 B2 | 12/2018 | Cheng et al. | |
| 2018/0261513 A1* | 9/2018 | Cheng | H01L 29/78642 |
| 2018/0294192 A1* | 10/2018 | Bao | H01L 29/785 |
| 2019/0181238 A1 | 6/2019 | Wang et al. | |

(Continued)

*Primary Examiner* — Michael M Trinh
(74) *Attorney, Agent, or Firm* — Samuel Waldbaum; Ryan, Mason & Lewis, LLP

(57) ABSTRACT

A method for manufacturing a vertical transistor device includes forming a plurality of fins on a substrate, and forming a gate dielectric layer on the fins and on the substrate adjacent the fins. In the method, one or more sacrificial layers are formed on the gate dielectric layer, and portions of the gate dielectric layer and the one or more sacrificial layers are removed to define a plurality of gate regions. The method also includes depositing a dielectric fill layer in gaps left by the removed gate dielectric and sacrificial layers, and selectively removing the remaining portions of the one or more sacrificial layers to form a plurality of vacant areas in the gate regions. First and second gate structures are respectively formed in first and second vacant areas of the plurality of vacant areas. The first and second gate structures are recessed to a uniform height.

20 Claims, 10 Drawing Sheets

(56) References Cited

U.S. PATENT DOCUMENTS

2019/0189613 A1\* 6/2019 Ha .................... H01L 29/785
2020/0066603 A1\* 2/2020 Bao ................ H01L 21/823842
2022/0037499 A1\* 2/2022 Chu .................. H01L 29/0673

\* cited by examiner

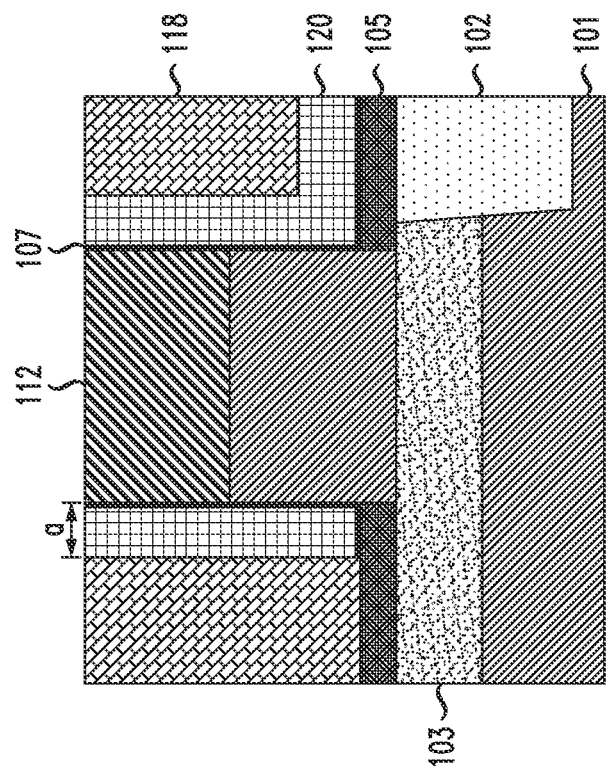
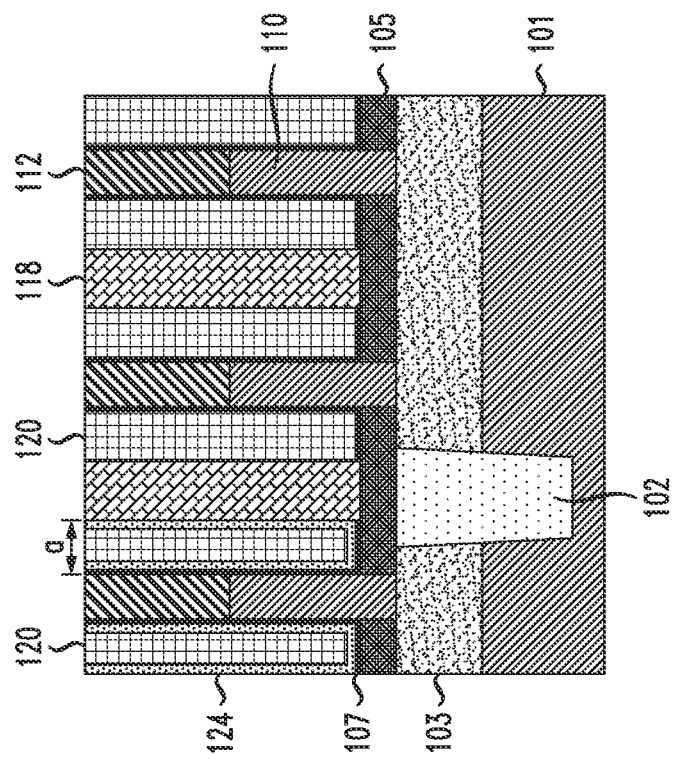

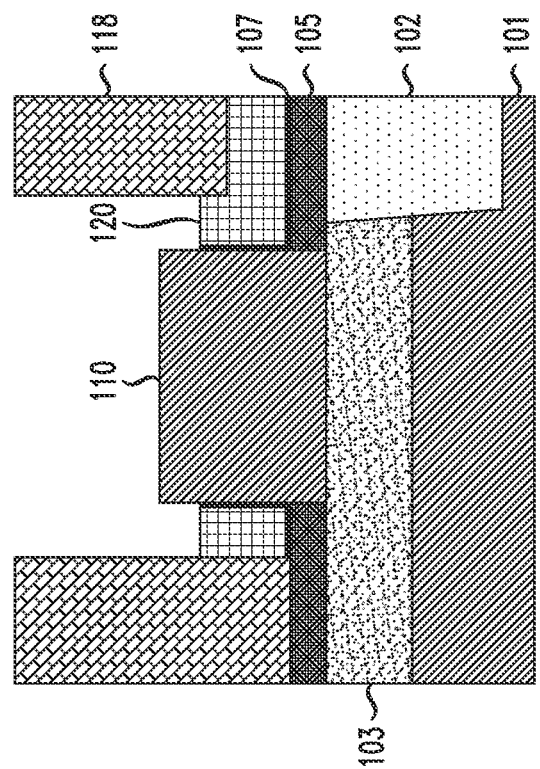
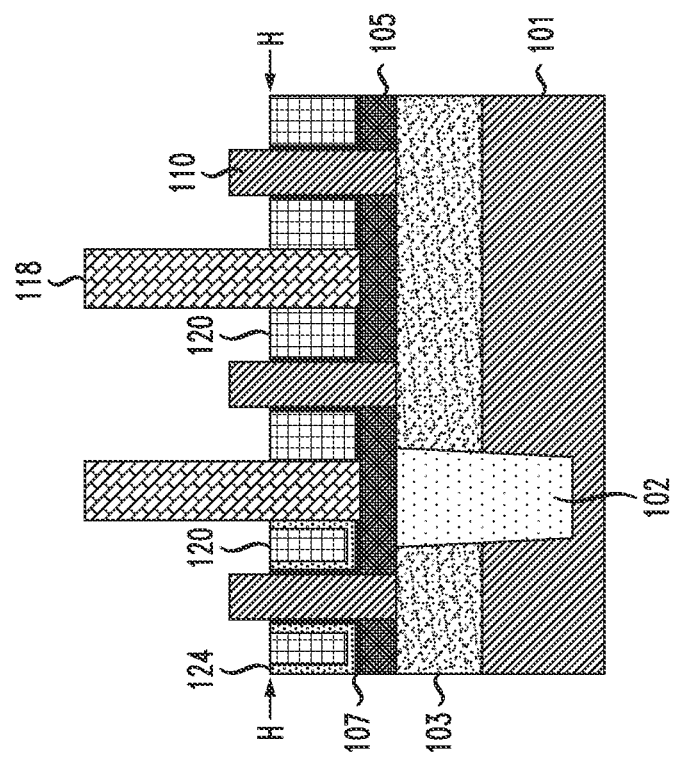

CONFINED GATE RECESSING FOR VERTICAL TRANSPORT FIELD EFFECT TRANSISTORS

BACKGROUND

Fin field-effect transistor (FinFET) devices include a transistor architecture that uses raised source-to-drain channel regions, referred to as fins. Known FinFET devices include fins with source/drain regions on lateral sides of the fins, so that current flows in a horizontal direction (e.g., parallel to a substrate) between source/drain regions at opposite ends of the fins in the horizontal direction. As horizontal devices are scaled down, there is reduced space for metal gate and source/drain contacts, which leads to degraded short-channel control and increased middle of the line (MOL) resistance.

Vertical transport field effect transistors (VTFETs) are becoming viable device options for semiconductor devices beyond 7 nanometer (nm) node. VTFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to address the limitations of horizontal device architectures by, for example, decoupling gate length from the contact gate pitch, providing a FinFET-equivalent density at a larger contacted poly pitch (CPP), and providing lower MOL resistance.

In conventional VTFET process flows, when gate structures are recessed, a recess depth is dependent on gate work function metal (WFM) thickness. Devices with different threshold voltages typically have different WFM thicknesses, such that recessing of gate structures for the different threshold voltage devices undesirably results in non-uniform recess depths.

SUMMARY

According to an exemplary embodiment of the present invention, a method for manufacturing a vertical transistor device includes forming a plurality of fins on a substrate, and forming a gate dielectric layer on the plurality of fins and on the substrate adjacent the plurality of fins. In the method, one or more sacrificial layers are formed on the gate dielectric layer, and portions of the gate dielectric layer and the one or more sacrificial layers are removed to define a plurality of gate regions. The method also includes depositing a dielectric fill layer in gaps left by the removed portions of the gate dielectric layer and the one or more sacrificial layers, and selectively removing the remaining portions of the one or more sacrificial layers to form a plurality of vacant areas in the plurality of gate regions. A first gate structure is formed in one or more first vacant areas of the plurality of vacant areas, and a second gate structure is formed in one or more second vacant areas of the plurality of vacant areas. The first and second gate structures are recessed to a uniform height.

According to an exemplary embodiment of the present invention, a vertical transistor device includes a plurality of fins disposed on a substrate. A first gate structure is disposed on the substrate adjacent one or more first device fins of the plurality of fins, and a second gate structure is disposed on the substrate adjacent one or more second device fins of the plurality of fins. The first gate structure includes a work function metal liner layer and a work function metal layer, and the second gate structure includes the work function metal layer. The first and second gate structures have the same height.

According to an exemplary embodiment of the present invention, a method for manufacturing a semiconductor device includes forming a plurality of vertical channel regions on a substrate, and forming a gate dielectric layer on the plurality of vertical channel regions and on the substrate adjacent the plurality of vertical channel regions. In the method, one or more sacrificial layers are conformally deposited on the gate dielectric layer, and portions of the gate dielectric layer and the one or more sacrificial layers are removed to define a plurality of gate regions. The method also includes depositing a dielectric fill layer in gaps left by the removed portions of the gate dielectric layer and the one or more sacrificial layers, and selectively removing the remaining portions of the one or more sacrificial layers to form a plurality of vacant areas in the plurality of gate regions. A first gate structure is formed in one or more first vacant areas of the plurality of vacant areas, and a second gate structure is formed in one or more second vacant areas of the plurality of vacant areas. The first and second gate structures are recessed to a uniform height.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 6A is a cross-sectional view taken across a plurality of fins and illustrating gate structure formation for different threshold voltage devices in a method of manufacturing a semiconductor device, according to an exemplary embodiment of the present invention.

FIG. 6B is a cross-sectional view taken along a length of a fin and illustrating gate structure formation for different threshold voltage devices in a method of manufacturing a semiconductor device, according to an exemplary embodiment of the present invention.

FIG. 9A is a cross-sectional view taken across a plurality of fins and illustrating gate structure recessing in a method of manufacturing a semiconductor device, according to an exemplary embodiment of the present invention.

FIG. 9B is a cross-sectional view taken along a length of a fin and illustrating gate structure recessing in a method of manufacturing a semiconductor device, according to an exemplary embodiment of the present invention.

DETAILED DESCRIPTION

Figure 1A:
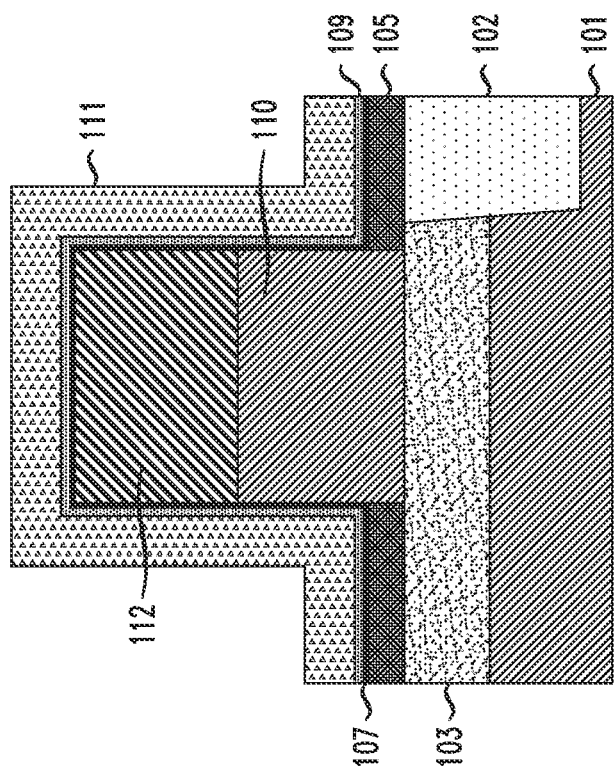
FIG. 1A is a cross-sectional view taken across a plurality of fins and illustrating dielectric and sacrificial layer deposition following fin, bottom source/drain region and bottom spacer formation in a method of manufacturing a semiconductor device, according to an exemplary embodiment of the present invention.

Exemplary embodiments of the invention will now be discussed in further detail with regard to semiconductor devices and methods of manufacturing same and, in particular, to multiple threshold voltage VTFET devices having uniform gate heights.

It is to be understood that the various layers and/or regions shown in the accompanying drawings are not drawn to scale, and that one or more layers and/or regions of a type commonly used in, for example, FinFET, VTFET, complementary metal-oxide-semiconductor (CMOS), field-effect transistor (FET), nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FinFETs, VTFETs, CMOSs, FETs, nanowire FETs, nanosheet FETs, SETs, and/or MOSFETs. By way of non-limiting example, the semiconductor devices can include, but are not necessarily limited to FinFET, VTFET, CMOS, FET, nanowire FET, nanosheet FET, SET, CMOS and MOSFET devices, and/or semiconductor devices that use FinFET, VTFET, CMOS, FET, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Embodiments of the present invention correspond to methods of fabricating and structures for VTFETs having uniform gate stack heights and different threshold voltages. A WFM liner is added to the gate structure of some VTFETs to vary the threshold voltage (Vt) while maintaining the same overall thickness (width) of the gate structures. Due to the same overall thickness, the gate structures with different threshold voltages can be recessed to the same height in a late gate recess process. In a non-limiting example, a lower Vt VTFET includes a gate structure having a WFM layer on a WFM liner layer, while the higher Vt VTFET includes a gate structure having the WFM layer without the WFM liner layer. The combined thickness (e.g., width) of the gate structure having the WFM layer on the WFM liner layer is the same as the thickness of the gate structure having the WFM layer without the WFM liner layer. As a result of the same thickness, the different gate structures can be recessed to the same height prior to forming top spacers and top source/drain regions during VTFET fabrication. In order to perform the recessing, wet or dry etch processes are used to etch the WFM liner layer and WFM layer at the same etch rate.

FIGS. 1A, 2A, 3A, 4A, 5A, 6A, 7A, 8A, 9A and 10A are cross-sectional views taken across a plurality of fins perpendicular to a length of the fins, and FIGS. 1B, 2B, 3B, 4B, 5B, 6B, 7B, 8B, 9B and 10B are cross-sectional views taken along (parallel to) a length of the fins.

Figure 1B:
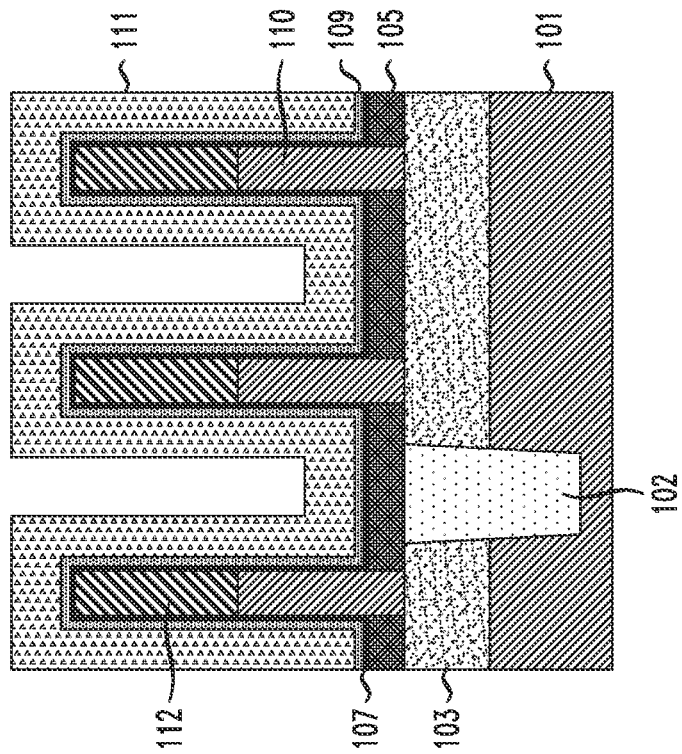
FIG. 1B is a cross-sectional view taken along a length of a fin and illustrating dielectric and sacrificial layer deposition following fin, bottom source/drain region and bottom spacer formation in a method of manufacturing a semiconductor device, according to an exemplary embodiment of the present invention.

Referring to FIGS. 1A and 1B, a semiconductor substrate 101 includes semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. In addition, multiple layers of the semiconductor materials can be used as the semiconductor material of the substrate. The semiconductor substrate 101 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide, nitride layer or aluminum oxide.

Fins, such as fins 110, can be formed by patterning part of the substrate 101, or a semiconductor layer on the substrate 101 into the fins 110. The possible materials of the fins 110 can be the same as those of the substrate 101, and the fins 110 can be formed of the same material as the substrate 101.

According to an embodiment, hardmasks 112 including, for example, a dielectric material, such as silicon nitride (SiN) are formed on portions of the substrate 101 or semiconductor layer that are to be formed into the fins 110. The fin patterning can be done by various patterning techniques, including, but not necessarily limited to, directional etching and/or a sidewall image transfer (SIT) process, for example. Alternatively, fin patterning can be done by any other suitable patterning technique, including but not limited to, lithography (e.g., extreme ultraviolet (EUV)) in conjunction with reactive ion etching (RIE), self-aligned double patterning (SADP), self-aligned multiple patterning (SAMP), and/or self-aligned quadruple patterning (SAQP)). While embodiments describe channel regions as fins, the embodiments are not necessarily limited to fin channel regions, and may include nanowire channel regions. In addition, although three fins 110 are shown in the figures for ease of explanation, more or less than three fins can be formed.

One or more trenches are formed in the substrate 101, by for example, a wet or dry etch process. A dielectric material layer including, but not necessarily limited to silicon oxide ($SiO_x$), where x is, for example, 2 in the case of silicon dioxide ($SiO_2$), or 1.99 or 2.01, low-temperature oxide (LTO), high-temperature oxide (HTO), flowable oxide (FOX), silicon oxycarbide (SiOC), silicon oxycarbonitride (SiOCN) or some other dielectric, is formed on the substrate 101 and in the trenches, and around the fins 110. The dielectric material can be deposited using deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering, followed by a planarization process, such as, chemical mechanical planarization (CMP) to remove excess dielectric material. Portions of the dielectric layer are removed from around the fins 110 to define one or more isolation regions 102, such as, for example, shallow trench isolation (STI) regions. The patterning of the dielectric layer can be performed using appropriate masking and removal techniques, including, but not necessarily limited to, RIE and optical lithography.

Bottom source/drain regions 103 are formed around the fins 110 and adjacent the isolation regions 102. The bottom source/drain regions 103 can be formed by a bottom-up epitaxial growth processes, wherein the bottom source/drain regions 103 are grown in one or more epitaxial processes to certain vertical height such as, but not necessarily limited to about 10 nm to about 50 nm. The epitaxially grown bottom source/drain regions 103 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1\times10^{18}/cm^3$ to $1\times10^{21}/cm^3$.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Referring further to FIGS. 1A and 1B, bottom spacer layers 105 are formed on the bottom source/drain regions 103 and the isolation regions 102. The bottom spacer layers 105 include, but are not necessarily limited to, silicon boron nitride (SiBN), siliconborocarbonitride (SiBCN), silicon oxycarbonitride (SiOCN), SiN or $SiO_x$. According to an embodiment of the present invention, the bottom spacer layers 105 are deposited using, for example, directional deposition techniques, including, but not necessarily limited to high density plasma (HDP) deposition and gas cluster ion beam (GCM) deposition. The directional deposition deposits the spacer material preferably on the exposed horizontal surfaces, but not on lateral sidewalls. Alternatively, the spacer material can be formed by overfilling the dielectric followed by planarization using a planarization process, such as, for example, CMP, and recessing the dielectric.

Following formation of the bottom spacer layers 105, a gate dielectric layer 107 is conformally deposited on the bottom spacer layers 105 and on and around the fins 110 including the hardmasks 112 thereon. The gate dielectric layer 107 is deposited using, for example, deposition techniques including, but not limited to, CVD, PECVD, RFCVD, PVD, ALD, MLD, MBD, PLD, LSMCD, sputtering, and/or plating. The gate dielectric layer includes, for example, a high-K material including but not necessarily limited to, $HfO_2$ (hafnium oxide), $ZrO_2$ (zirconium dioxide), hafnium zirconium oxide $Al_2O_3$ (aluminum oxide), and $Ta_2O_5$ (tantalum pentoxide). A thickness of the gate dielectric layer 107 is about 1 nm to about 3 nm.

A first sacrificial layer 109 including, for example, titanium nitride (TiN), titanium carbide (TiC), or titanium aluminum carbide (TiAlC), is conformally deposited on the gate dielectric layer 107 on the bottom spacer layers 105 and on and around the fins 110 including the hardmasks 112 thereon. A second sacrificial layer 111 including, for example, amorphous silicon germanium (a-SiGe) or amorphous silicon (a-Si) is conformally deposited on the first sacrificial layer 109, which is on the gate dielectric layer 107, the bottom spacer layers 105 and on and around the fins 110 including the hardmasks 112 thereon. The first and second sacrificial layers 109 and 111 can be deposited using the same or similar deposition techniques as those listed for the gate dielectric layer 107. A thickness of the first sacrificial layer 109 is about 5 angstroms to about 30 angstroms, and a thickness of the second sacrificial layer 111 is about 5 nm to about 20 nm. Deposition of the layers 107, 109 and 111 is followed by a reliability anneal process. For example, the reliability annealing process includes a rapid thermal annealing (RTA) at about 800° C.-about 1000° C. Other annealing techniques include, but are not limited to, flash anneal, laser anneal, furnace anneal, etc.

Figure 2B:
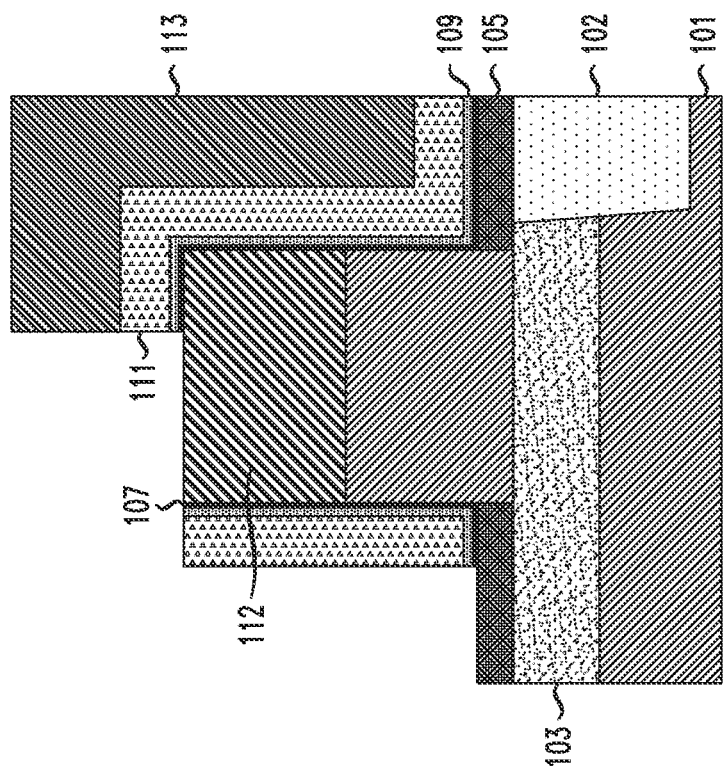
FIG. 2B is a cross-sectional view taken along a length of a fin and illustrating self-aligned gate structure patterning by removal of portions of the dielectric and sacrificial layers in a method of manufacturing a semiconductor device, according to an exemplary embodiment of the present invention.
Figure 2A:
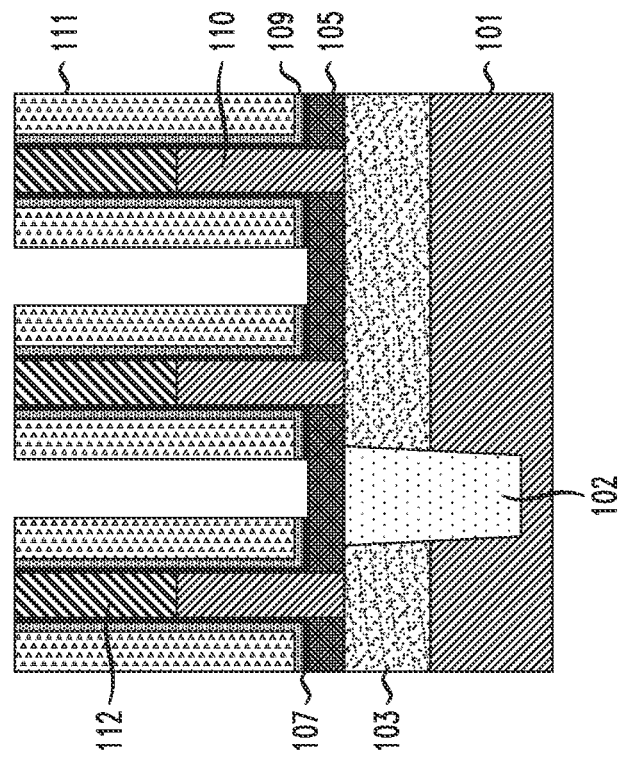
FIG. 2A is a cross-sectional view taken across a plurality of fins and illustrating self-aligned gate structure patterning by removal of portions of the dielectric and sacrificial layers in a method of manufacturing a semiconductor device, according to an exemplary embodiment of the present invention.

Referring to FIGS. 2A and 2B, self-aligned gate structure patterning is performed by removal of portions of the gate dielectric layer 107 and first and second sacrificial layers 109 and 111. Prior to removal, part of the gate dielectric layer 107 and first and second sacrificial layers 109 and 111 is masked by a mask layer 113, such as, for example an organic planarization layer (OPL). The OPL includes, but is not necessarily limited to, an organic polymer including C, H, and N. In an embodiment, the OPL material can be free of silicon (Si). According to an embodiment, the OPL material can be free of Si and fluorine (F). As defined herein, a material is free of an atomic element when the level of the atomic element in the material is at or below a trace level detectable with analytic methods available in the art. Non-limiting examples of the OPL material include JSR HM8006, JSR HM8014, AZ UM10M2, Shin Etsu ODL 102, or other similar commercially available materials from such vendors as JSR, TOK, Sumitomo, Rohm & Haas, etc. The mask layer 113 can be deposited, for example, by spin coating.

Following formation of the mask layer 113, horizontal portions of the second sacrificial layer 111 and underlying portions of the gate dielectric and first sacrificial layers 107 and 109 are removed in one or more directional etching processes, such as for example, RIE processes. The remaining portions of the gate dielectric layer 107 and first and second sacrificial layers 109 and 111 are located where the resulting gate structures will be formed (see FIGS. 6A and 6B) so that gate regions and non-gate regions are defined. The gate regions are defined by the remaining portions of the gate dielectric layer 107 and first and second sacrificial layers 109 and 111, and the non-gate regions are defined by the gaps between the remaining portions of the gate dielectric layer 107 and first and second sacrificial layers 109 and 111.

Figure 3A:
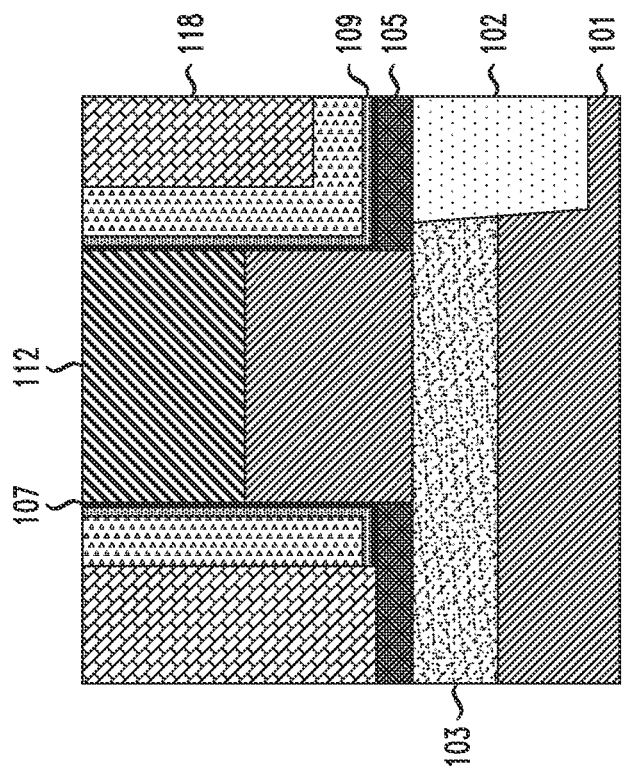
FIG. 3A is a cross-sectional view taken across a plurality of fins and illustrating dielectric layer deposition and planarization in a method of manufacturing a semiconductor device, according to an exemplary embodiment of the present invention.
Figure 3B:
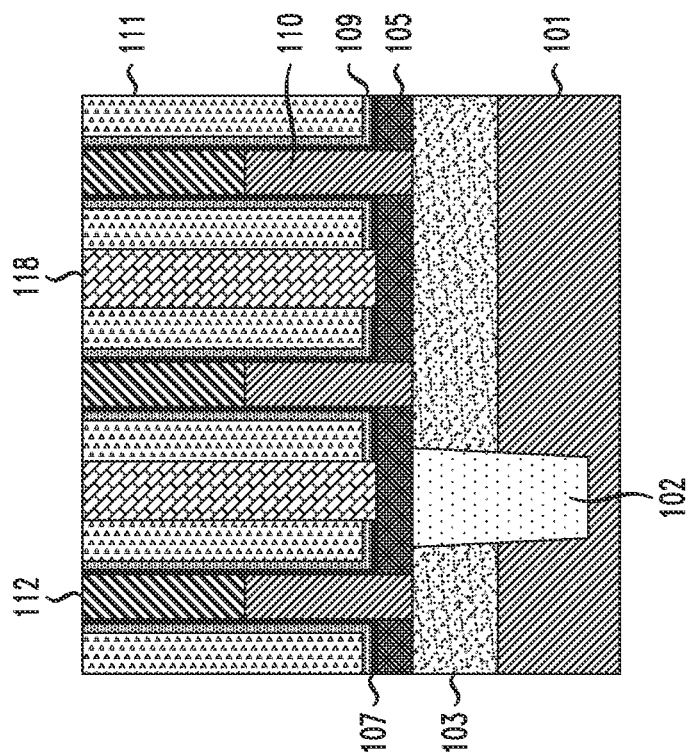
FIG. 3B is a cross-sectional view taken along a length of a fin and illustrating dielectric layer deposition and planarization in a method of manufacturing a semiconductor device, according to an exemplary embodiment of the present invention.

Referring to FIGS. 3A and 3B, dielectric fill layers 118 (also referred to herein as an inter-layer dielectric (ILD) layers) are formed on the bottom spacer layers 105 to fill in gaps between the remaining portions of the gate dielectric layer 107 and first and second sacrificial layers 109 and 111. A dielectric fill layer 118 is also formed on remaining portions of the second sacrificial layer 111 that were masked by the mask layer 113 during the directional removal described in connection with FIGS. 2A and 2B. The dielectric fill layers 118 include, but are not necessarily limited to, silicon oxide, flowable oxide, spin-on-glass, SiN or a combination of several different layers. According to an embodiment, the dielectric fill layers 118 are deposited using, for example, deposition techniques including, but not limited to, CVD, PECVD, RFCVD, PVD, ALD, MLD, MBD, PLD, LSMCD, sputtering, and/or plating, followed by a planarization process, such as, for example, CMP.

Figure 4B:
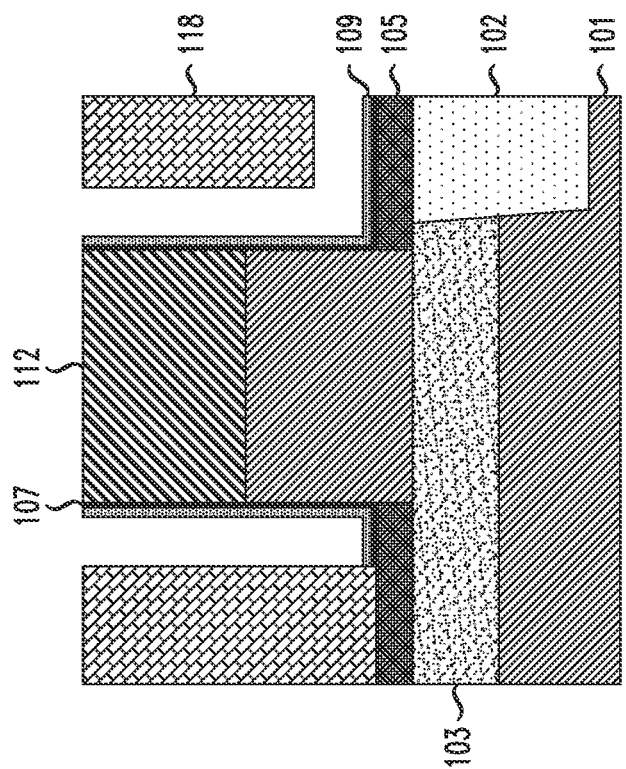
FIG. 4B is a cross-sectional view taken along a length of a fin and illustrating removal of a sacrificial layer in a method of manufacturing a semiconductor device, according to an exemplary embodiment of the present invention.
Figure 4A:
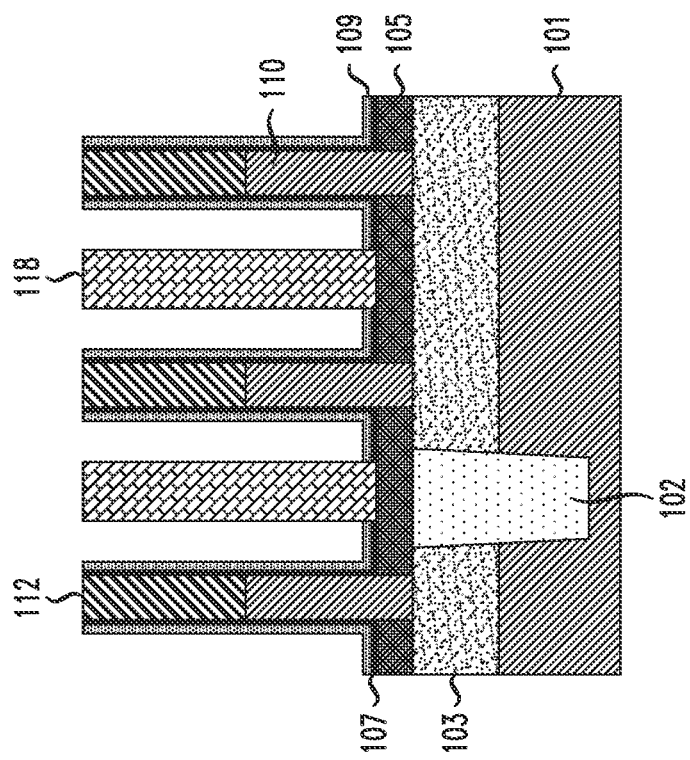
FIG. 4A is a cross-sectional view taken across a plurality of fins and illustrating removal of a sacrificial layer in a method of manufacturing a semiconductor device, according to an exemplary embodiment of the present invention.
Figure 5B:
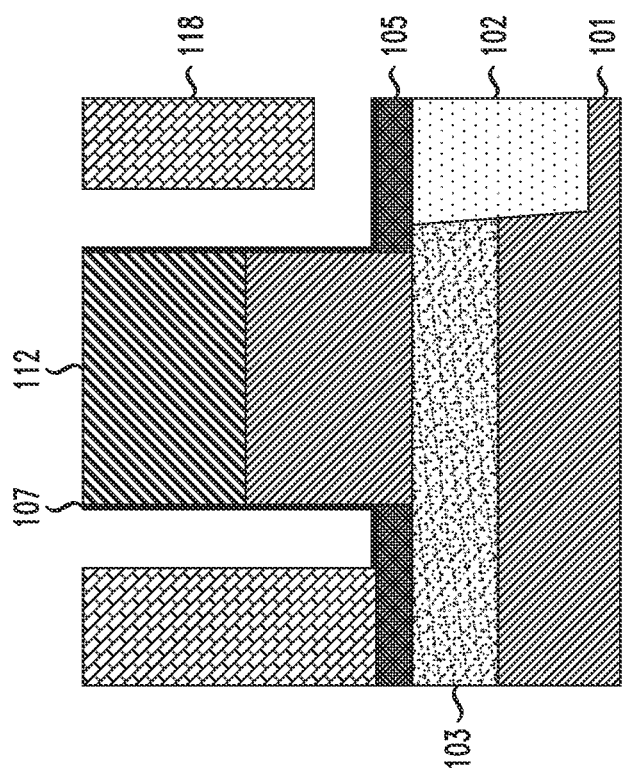
FIG. 5B is a cross-sectional view taken along a length of a fin and illustrating removal of another sacrificial layer in a method of manufacturing a semiconductor device, according to an exemplary embodiment of the present invention.
Figure 5A:
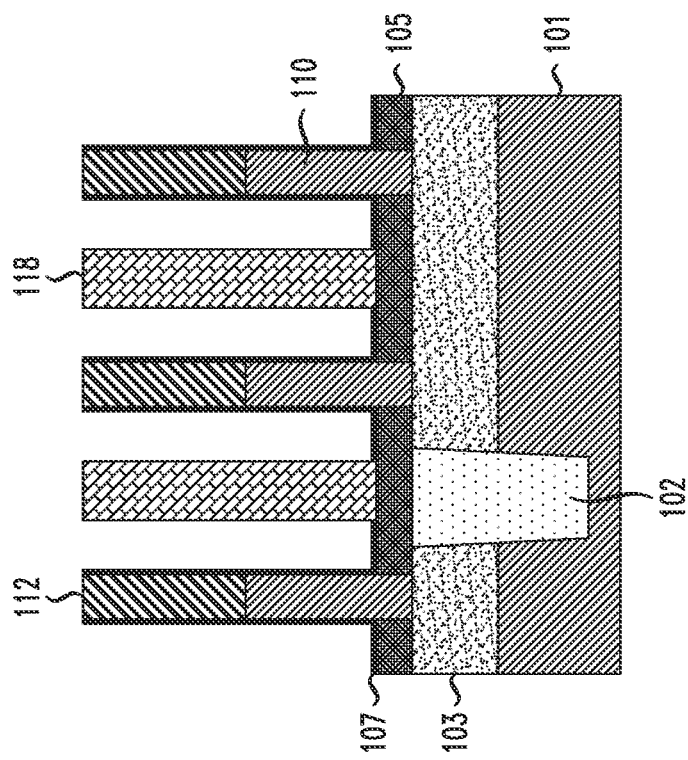
FIG. 5A is a cross-sectional view taken across a plurality of fins and illustrating removal of another sacrificial layer in a method of manufacturing a semiconductor device, according to an exemplary embodiment of the present invention.

Referring to FIGS. 4A and 4B, the remaining portions of the second sacrificial layer 111 are selectively removed, which exposes the underlying first sacrificial layer 109. The second sacrificial layer 111 is removed using for example, an isotropic wet etch such as with hot ammonia, or vapor phased dry etch using HC1. Then, referring to FIGS. 5A and 5B, the remaining portions of the first sacrificial layer 109 are selectively removed, which exposes the underlying gate dielectric layer 107. The first sacrificial layer 109 is removed using for example, a wet etch process such as an SC1 cleaning process.

Referring to FIGS. 6A and 6B, gate structures for different threshold voltage devices are formed on the remaining gate dielectric layers 107 in the vacant areas adjacent the fins 110 and/or dielectric fill layers 118 left by the removal of the remaining portions of the first and second sacrificial layers 109 and 111. For example, a gate structure for a first VTFET device having a first threshold voltage includes a WFM layer 120 on a WFM liner layer 124, which is on the gate dielectric layer 107, and gate structures for second VTFET devices, each having a second threshold voltage (e.g., higher than the first threshold voltage), include a WFM layer 120 on the gate dielectric layer 107 without the WFM liner layer 124. As can be seen, the thicknesses "a" (e.g., width) of the gate structures for the first VTFET device and for the second VTFET devices are the same regardless of whether there is a threshold voltage difference. The thicknesses "a" were previously defined by the deposited first and second sacrificial layers 109 and 111 and gate dielectric layer 107.

According to a non-limiting embodiment, the WFM liner layers 124 comprise TiN and are in a U-shape, being formed on lateral sides of the fins 110 and/or dielectric fill layers 118, and on the top surface of the bottom spacer layers 105. A thickness of the WFM liner layer 124 is about 10 angstroms to about 70 angstroms. According to an embodiment, the WFM layers 120 comprise, for example, TiN/titanium aluminum carbide (TiAlC)/TiN and fill in remaining portions of the vacant areas adjacent the fins 110 and/or dielectric fill layers 118. Alternative materials for the WFM liner layer 124 may comprise, but are not necessarily limited to, TaN or Pt. Alternative materials for the WFM layer 120 may comprise, but are not necessarily limited to, titanium aluminum nitride (TiAlN), titanium aluminum carbon nitride (TiAlCN), titanium carbide (TiC), tantalum aluminum carbide (TaAlC), tantalum aluminum carbon nitride (TaAlCN) or lanthanum (La) doped TiN or tantalum nitride (TaN).

The WFM liner layers 124 and WFM layers 120 are deposited using, for example, deposition techniques including, but not limited to, CVD, PECVD, RFCVD, PVD, ALD, MLD, MBD, PLD, LSMCD, sputtering, and/or plating, followed by planarization, such as, for example, CMP, to remove excess portions of the WFM liner layers 124 and WFM layers 120 from upper surfaces of the dielectric fill layers 118 and hardmask layers 112.

According to an embodiment, the WFM liner layers 124 are conformally deposited in each of the vacant areas adjacent the fins 110 and/or dielectric fill layers 118, and removed from those areas where gate structures for the second VTFET devices having the second threshold voltage are to be formed. The removal can be performed by masking the areas where the gate structures for the first VTFET devices having the first threshold voltage are to be formed, and etching the exposed WFM liner layers 124 from the areas where gate structures for the second VTFET devices having the second threshold voltage are to be formed. The embodiments are not limited to the number of first and second VTFET devices shown in FIGS. 6A and 6B. For example, there may be more first VTFET devices having the WFM liner and WFM layers 124 and 120 and less second VTFET devices having only the WFM layer 120. The threshold voltage of the first VTFET devices is lower than the threshold voltage of the second VTFET devices. Although the embodiments illustrate devices with two different threshold voltages, the embodiments are not necessarily limited thereto, and there can be more than two different threshold voltages. The embodiments can be used multiple times to generate multiple devices with different threshold voltages having same thicknesses "a" as described herein.

Figure 7B:
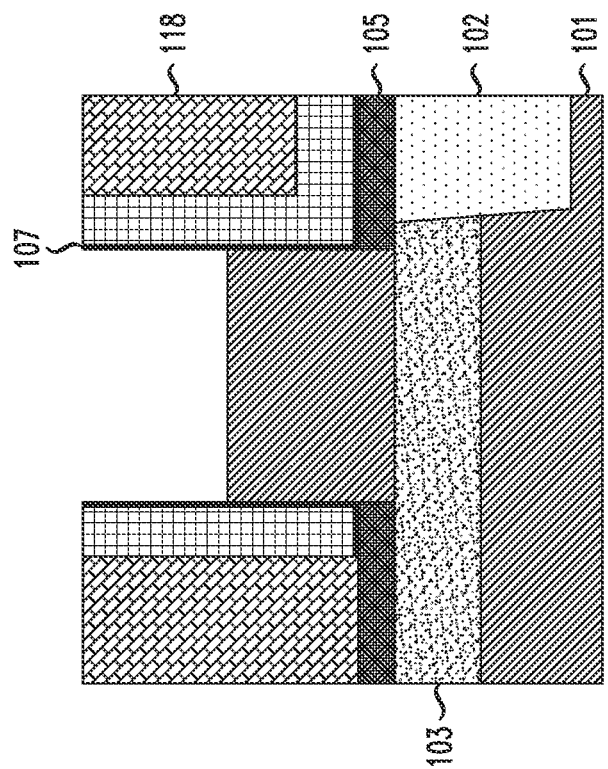
FIG. 7B is a cross-sectional view taken along a length of a fin and illustrating hardmask removal in a method of manufacturing a semiconductor device, according to an exemplary embodiment of the present invention.
Figure 7A:
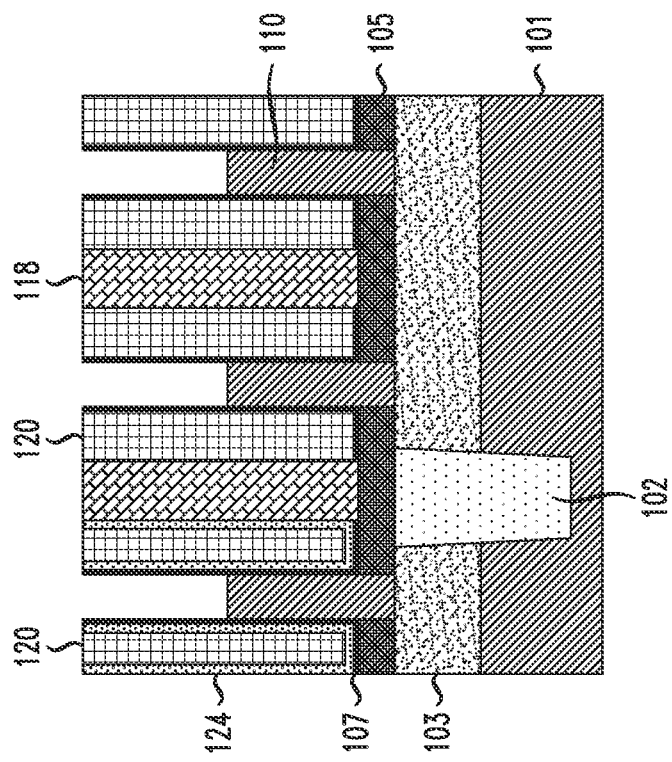
FIG. 7A is a cross-sectional view taken across a plurality of fins and illustrating hardmask removal in a method of manufacturing a semiconductor device, according to an exemplary embodiment of the present invention.

Referring to FIGS. 7A and 7B, the hardmask layers 112 are selectively removed. The removal is performed using, for example, a selective etch process, which is selective to the material of the WFM liner and WFM layers 124 and 120, and gate dielectric layers 107. The selective etch process can include, for example, dilute hydrofluoric acid (dHF) clean or hot phosphorous clean processes, or vapor phased dry etch with selective dielectric removal chemicals.

Figure 8B:
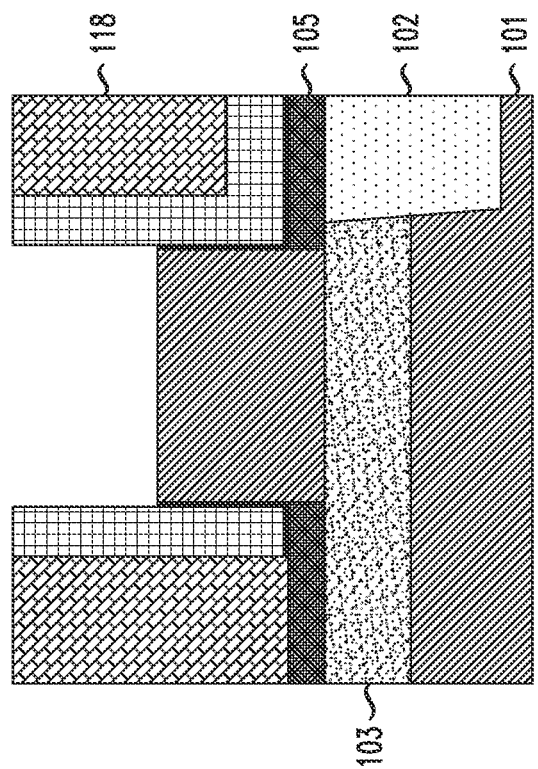
FIG. 8B is a cross-sectional view taken along a length of a fin and illustrating removal of exposed portions of a dielectric layer in a method of manufacturing a semiconductor device, according to an exemplary embodiment of the present invention.
Figure 8A:
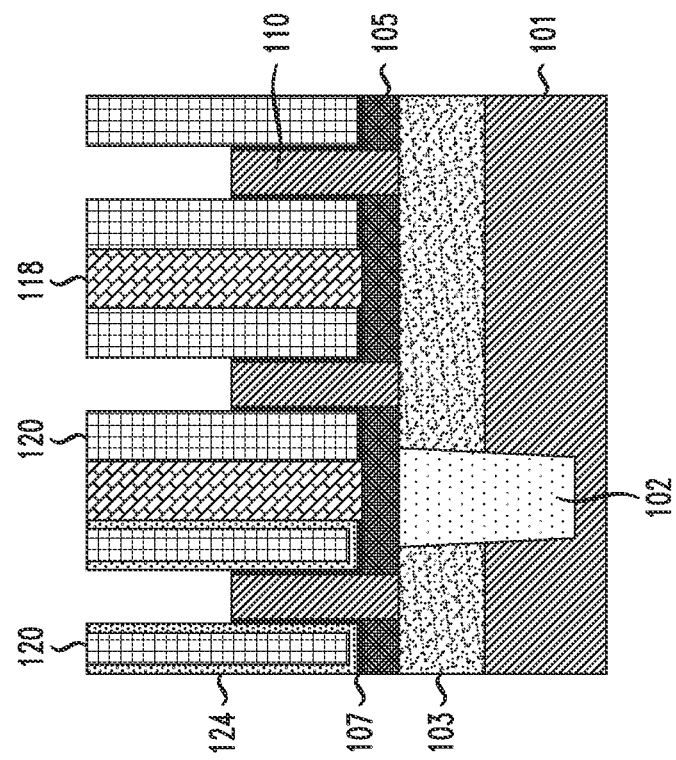
FIG. 8A is a cross-sectional view taken across a plurality of fins and illustrating removal of exposed portions of a dielectric layer in a method of manufacturing a semiconductor device, according to an exemplary embodiment of the present invention.

Then, referring to FIGS. 8A and 8B, the portions of the gate dielectric layer 107 exposed after hardmask removal are removed from the areas above the top surfaces of the fins 110. The removal is performed using, for example, a selective etch process, which is selective to the material of the WFM liner and WFM layers 124 and 120. The selective etch process can include, for example, wet HF:HC1 etch.

Referring to FIGS. 9A and 9B, the WFM liner layers 124 and the WFM layers 120 are recessed to height H below the top surfaces of the fins 110, followed by removal of exposed portions of the gate dielectric layers 107. The resulting gate structures including the recessed WFM liner layers 124 and the WFM layers 120 and the gate dielectric layers 107, or the WFM layers 120 (without the WFM liner layers 124) and the gate dielectric layers 107 have the uniform vertical height H. As noted above in connection with FIGS. 6A and 6B, since the thickness "a" of the WFM gate stacks are the same for the first and second VTFET devices, the WFM recess depth for the different devices having WFM liner layers 124 and the WFM layers 120, or the WFM layers 120 without the WFM liner layers 124, can be controlled uniformly. Accordingly, the recessed gate structures have the same height regardless of their threshold voltage difference. The embodiments use wet or dry etch processes to etch the WFM liner layers 124 and the WFM layers 120 at the same etch rate. Such wet or dry etch processes include, for example, SC1, $H_2O_2$, citric acid, etc., at certain optimized ratios and temperatures.

The portions of the gate dielectric layer 107 exposed after recessing of the WFM liner layers 124 and WFM layers 120 are removed from the areas above the top surfaces of the recessed WFM liner layers 124 and WFM layers 120. The removal is performed using, for example, wet HF: HC1 etch.

Figure 10B:
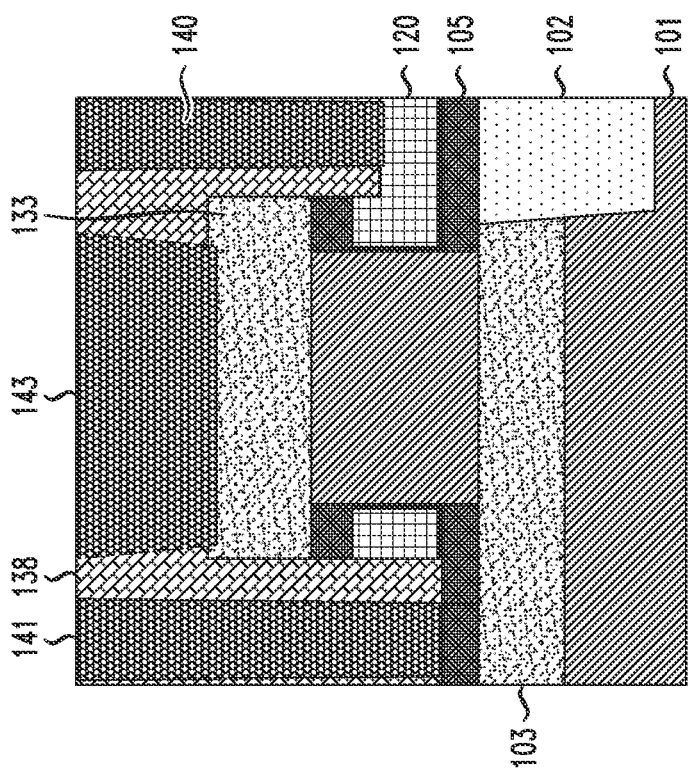
FIG. 10B is a cross-sectional view taken along a length of a fin and illustrating top spacer, top source/drain region and contact formation in a method of manufacturing a semiconductor device, according to an exemplary embodiment of the present invention.
Figure 10A:
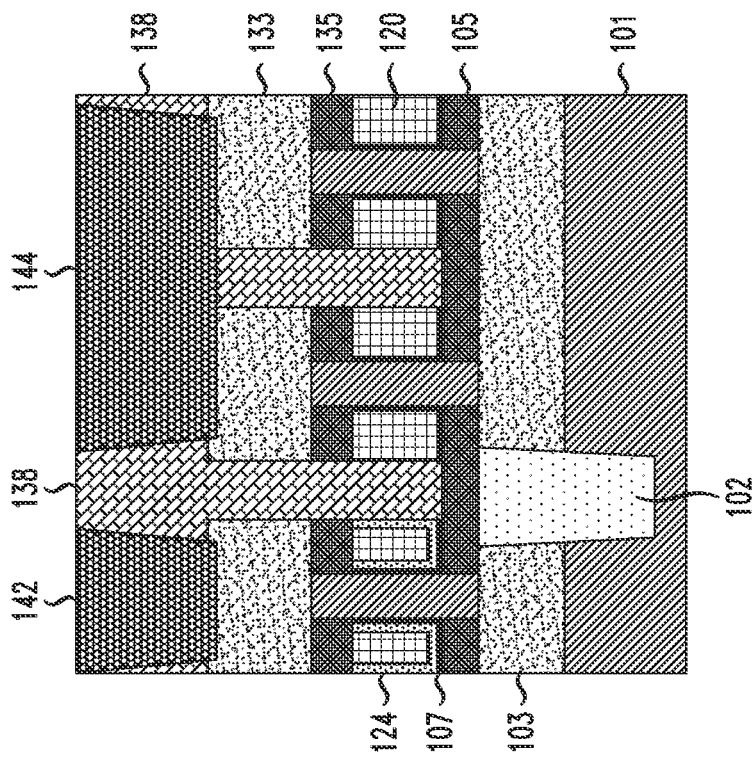
FIG. 10A is a cross-sectional view taken across a plurality of fins and illustrating top spacer, top source/drain region and contact formation in a method of manufacturing a semiconductor device, according to an exemplary embodiment of the present invention.

Referring to FIGS. 10A and 10B, top spacer layers 135, top source/drain regions 133, upper dielectric fill layers 138 and gate and source/drain contacts 140, 141, 142, 143 and 144 are formed. Top spacer layers 135 are formed around the fins 110, and on the gate structures including the gate dielectric layers 107 and WFM layers 120 or the gate dielectric layers 107 and the combination of the WFM layers 120 and WFM liner layers 124. The top spacer layers 135 include, but are not necessarily limited to, SiN, SiBN, SiBCN or SiOCN. According to an embodiment, the top spacer layers 135 are deposited using, for example, deposition techniques including, but not limited to, CVD, PECVD, RFCVD, PVD, ALD, MLD, MBD, PLD, LSMCD, sputtering, and/or plating.

Top source/drain regions 133 are epitaxially grown in epitaxial growth processes from the upper portions of the fins 110. The epitaxially grown top source/drain regions 133 can be in-situ doped. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1\times10^{18}/cm^3$ to $1\times10^{21}/cm^3$.

An upper dielectric fill layer 138 is formed on the top source/drain regions 133 and the existing dielectric fill layer 118 and in gaps between the top source/drain regions 133. The upper dielectric fill layer 138 includes, but is not necessarily limited to, silicon oxide, flowable oxide, or spin-on-glass. According to an embodiment of the present invention, the upper dielectric fill layer 138 is deposited using, for example, deposition techniques including, but not limited to, CVD, PECVD, RFCVD, PVD, ALD, MLD, MBD, PLD, LSMCD, sputtering, and/or plating, followed by a planarization process, such as, for example, CMP.

Trenches are opened in the upper and lower dielectric fill layers 138 and 118 over the top source/drain regions 133, bottom source/drain regions 103 and gate structures for the first and second VTFET devices using, for example, lithography followed by RIE. In a non-limiting example, as shown in FIGS. 10A and 10B, contacts 142, 143 and 144 to top source/drain regions 133, contact 141 to bottom source/drain region 103 and contact 140 to a gate structure for a second VTFET device comprising the WFM layer 120 without the WFM layer 124 are formed in respective trenches by filling the trenches with a contact material layer, such as, for example, electrically conductive material including, but not necessarily limited to, tungsten, cobalt, zirconium, tantalum, titanium, aluminum, ruthenium, and/or copper. A liner layer including, for example, titanium and/or titanium nitride, may be formed on side and bottom surfaces of the trench and on the top source/drain regions 133, the bottom source/drain region 103 or the gate structure before filling the trenches with the contact material layer. The contact 144, which is a single contact region in one trench to multiple source/drain regions 133, as opposed to multiple contacts in respective trenches to corresponding source/drain regions, increases the area and volume of the contact region, resulting in a lower resistance of the contact region than when a plurality of contacts are used.

Deposition of the contact material layer can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A vertical transistor device, comprising:
a plurality of fins disposed on a substrate;
a first gate structure disposed on the substrate adjacent one or more first device fins of the plurality of fins, wherein the first gate structure comprises a work function metal liner layer and a work function metal layer;
a second gate structure disposed on the substrate adjacent one or more second device fins of the plurality of fins, wherein the second gate structure comprises without the work function metal liner layer;
a bottom source/drain region at a base of the plurality of fins;
an isolation region disposed between portions of the bottom source/drain region;
a bottom spacer layer disposed between the bottom source/drain region and the first and second gate structures, wherein a portion of the bottom spacer layer is disposed on top of the isolation region; and
a dielectric fill layer disposed on the portion of the bottom spacer layer, wherein the work function metal liner layer of the first gate structure contacts a first lateral side of the dielectric fill layer and the work function metal layer of the second gate structure contacts a second lateral side of the dielectric fill layer opposite the first lateral side;
wherein the first and second gate structures have the same height;
wherein a thickness of the first gate structure comprising the work function metal liner layer and the work function metal layer is the same as a thickness of the second gate structure comprising the work function metal layer without the work function metal liner layer;
wherein the work function metal layer comprises at least one of titanium and tantalum in one of a nitride composition and a carbide composition;
wherein the thickness of the second gate structure is defined by a first lateral edge and a second lateral edge of the second gate structure; and
wherein, at at least a top surface of the second gate structure, the work function metal layer continuously extends across the thickness of the second gate structure from the first lateral edge of the second gate structure to the second lateral edge of the second gate structure.

2. The vertical transistor device according to claim 1, wherein the work function metal liner layer comprises a U-shape.

3. The vertical transistor device according to claim 1, wherein a threshold voltage for the first gate structure is different from a threshold voltage for the second gate structure.

4. The vertical transistor device according to claim 1, further comprising a gate dielectric layer disposed under the work function metal liner layer of the first gate structure and disposed under the work function layer of the second gate structure.

5. The vertical transistor device according to claim 1, further comprising a top source/drain region on top of the plurality of fins.

6. The vertical transistor device according to claim 5, further comprising a top spacer layer between the top source/drain region and the first and second gate structures.

7. The vertical transistor device according to claim 1, wherein a thickness of the work function metal layer of the first gate structure is less than a thickness of the work function metal layer of the second gate structure.

8. The vertical transistor device according to claim 1, wherein the dielectric fill layer is disposed between the first gate structure and the second gate structure.

9. The vertical transistor device according to claim 5, wherein the dielectric fill layer is disposed between first and second portions of the top source/drain region.

10. The vertical transistor device according to claim 9, wherein the dielectric fill layer is further disposed between first and second contacts respectively contacting the first and second portions of the top source/drain region.

11. A semiconductor device, comprising:
a plurality of vertical channel regions disposed on a substrate;
a first gate structure disposed on the substrate adjacent one or more first device vertical channel regions of the plurality of vertical channel regions, wherein the first gate structure comprises a work function metal liner layer and a work function metal layer;
a second gate structure disposed on the substrate adjacent one or more second device vertical channel regions of the plurality of vertical channel regions, wherein the second gate structure comprises the work function metal layer without the work function metal liner layer;
a bottom source/drain region at a base of the plurality of vertical channel regions;
an isolation region disposed between portions of the bottom source/drain region;
a bottom spacer layer disposed between the bottom source/drain region and the first and second gate structures, wherein a portion of the bottom spacer layer is disposed on top of the isolation region; and
a dielectric fill layer disposed on the portion of the bottom spacer layer, wherein the work function metal liner layer of the first gate structure contacts a first lateral side of the dielectric fill layer and the work function metal layer of the second gate structure contacts a second lateral side of the dielectric fill layer opposite the first lateral side;
wherein the first and second gate structures have the same height;
wherein a thickness of the first gate structure comprising the work function metal liner layer and the work function metal layer is the same as a thickness of the second gate structure comprising the work function metal layer without the work function metal liner layer;
wherein the work function metal layer comprises at least one of titanium and tantalum in one of a nitride composition and a carbide composition;
wherein the thickness of the second gate structure is defined by a first lateral edge and a second lateral edge of the second gate structure; and
wherein, at at least a top surface of the second gate structure, the work function metal layer continuously extends across the thickness of the second gate structure from the first lateral edge of the second gate structure to the second lateral edge of the second gate structure.

12. The semiconductor device according to claim 11, wherein the work function metal liner layer comprises a U-shape.

13. The semiconductor device according to claim 11, wherein a threshold voltage for the first gate structure is different from a threshold voltage for the second gate structure.

14. The semiconductor device according to claim 11, further comprising a gate dielectric layer disposed under the work function metal liner layer of the first gate structure and disposed under the work function layer of the second gate structure.

15. The semiconductor device according to claim 11, further comprising a top source/drain region on top of the plurality of vertical channel regions.

16. The semiconductor device according to claim 15, further comprising a top spacer layer between the top source/drain region and the first and second gate structures.

17. The semiconductor device according to claim 11, wherein a thickness of the work function metal layer of the first gate structure is less than a thickness of the work function metal layer of the second gate structure.

18. The semiconductor device according to claim 11, wherein the dielectric fill layer is disposed between the first gate structure and the second gate structure.

19. The semiconductor device according to claim 15, wherein the dielectric fill layer is disposed between first and second portions of the top source/drain region.

20. The semiconductor device according to claim 19, wherein the dielectric fill layer is further disposed between first and second contacts respectively contacting the first and second portions of the top source/drain region.

* * * * *